(12) United States Patent
Lesher

(10) Patent No.: US 7,250,626 B2
(45) Date of Patent: Jul. 31, 2007

(54) PROBE TESTING STRUCTURE

(75) Inventor: Timothy E. Lesher, Portland, OR (US)

(73) Assignee: Cascade Microtech, Inc., Beaverton, OR (US)

(*) Notice: Subject to any disclaimer, the term of this patent is extended or adjusted under 35 U.S.C. 154(b) by 0 days.

(21) Appl. No.: 10/794,246

(22) Filed: Mar. 5, 2004

(65) Prior Publication Data

US 2005/0088191 A1    Apr. 28, 2005

Related U.S. Application Data

(60) Provisional application No. 60/513,663, filed on Oct. 22, 2003.

(51) Int. Cl.
*H01L 23/58* (2006.01)
*H01L 29/80* (2006.01)
*G01R 31/02* (2006.01)
*H01P 1/16* (2006.01)

(52) U.S. Cl. .................... 257/48; 257/275; 324/614; 324/754; 333/251

(58) Field of Classification Search .............. 257/48, 257/275; 324/614, 754; 333/251
See application file for complete search history.

(56) References Cited

U.S. PATENT DOCUMENTS

| | | | |
|---|---|---|---|
| 1,337,866 A | 4/1920 | Whitaker |
| 2,142,625 A | 1/1939 | Zoethoul |
| 2,197,081 A | 4/1940 | Piron |
| 2,376,101 A | 5/1945 | Tyzzer |
| 2,389,668 A | 11/1945 | Johnson |
| 2,471,897 A | 5/1949 | Rappl |
| 2,812,502 A | 11/1957 | Doherty |
| 3,176,091 A | 3/1965 | Hanson et al. |
| 3,185,927 A | 5/1965 | Margulis et al. |
| 3,192,844 A | 7/1965 | Szasz et al. |
| 3,193,712 A | 7/1965 | Harris |
| 3,201,721 A | 8/1965 | Voelcker |
| 3,230,299 A | 1/1966 | Radziejowski |
| 3,256,484 A | 6/1966 | Terry |
| 3,265,969 A | 8/1966 | Catu |
| 3,289,046 A | 11/1966 | Carr |
| 3,333,274 A | 7/1967 | Forcier |
| 3,405,361 A | 10/1968 | Kattner et al. |
| 3,408,565 A | 10/1968 | Frick et al. |
| 3,435,185 A | 3/1969 | Gerard |
| 3,484,679 A | 12/1969 | Hodgson et al. |
| 3,596,228 A | 7/1971 | Reed, Jr. |
| 3,602,845 A | 8/1971 | Agrios et al. |

(Continued)

FOREIGN PATENT DOCUMENTS

DE        29 12 826        3/1979

(Continued)

OTHER PUBLICATIONS

"A Guide to Better Vector Network Analyzer Calibrations for Probe-Tip Measurements," TECHBRIEF4-0694, Cascade Microtech, Inc, Beaverton, Oregon, copyrighted in 1994.

(Continued)

*Primary Examiner*—Shouxiang Hu
(74) *Attorney, Agent, or Firm*—Chernoff, Vilhauer, McClung & Stenzel

(57) ABSTRACT

A calibration structure for probing devices.

5 Claims, 11 Drawing Sheets

U.S. PATENT DOCUMENTS

| | | |
|---|---|---|
| 3,609,539 A | 9/1971 | Gunthert |
| 3,648,169 A | 3/1972 | Wiesler |
| 3,654,573 A | 4/1972 | Graham |
| 3,662,318 A | 5/1972 | Decuyper |
| 3,710,251 A | 1/1973 | Hagge et al. |
| 3,714,572 A | 1/1973 | Ham et al. |
| 3,775,644 A | 11/1973 | Cotner et al. |
| 3,777,260 A | 12/1973 | Davies et al. |
| 3,810,017 A | 5/1974 | Wiesler et al. |
| 3,814,888 A | 6/1974 | Bowers et al. |
| 3,829,076 A | 8/1974 | Sofy |
| 3,863,181 A | 1/1975 | Glance et al. |
| 3,866,093 A | 2/1975 | Kusters et al. |
| 3,930,809 A | 1/1976 | Evans |
| 3,936,743 A | 2/1976 | Roch |
| 3,970,934 A | 7/1976 | Aksu |
| 3,996,517 A | 12/1976 | Fergason et al. |
| 4,001,685 A | 1/1977 | Roch |
| 4,008,900 A | 2/1977 | Khoshaba |
| 4,009,456 A | 2/1977 | Hopfer |
| 4,027,253 A | 5/1977 | Chiron et al. |
| 4,035,723 A | 7/1977 | Kvaternik |
| 4,038,894 A | 8/1977 | Knibbe et al. |
| 4,042,119 A | 8/1977 | Hassan et al. |
| 4,049,252 A | 9/1977 | Bell |
| 4,066,943 A | 1/1978 | Roch |
| 4,093,988 A | 6/1978 | Scott |
| 4,099,120 A | 7/1978 | Aksu |
| 4,115,735 A | 9/1978 | Stanford |
| 4,115,736 A | 9/1978 | Tracy |
| 4,116,523 A | 9/1978 | Coberly et al. |
| 4,151,465 A | 4/1979 | Lenz |
| 4,161,692 A | 7/1979 | Tarzwell |
| 4,172,993 A | 10/1979 | Leach |
| 4,186,338 A | 1/1980 | Fichtenbaum |
| 4,275,446 A | 6/1981 | Blaess |
| 4,280,112 A | 7/1981 | Eisenhart |
| 4,284,033 A | 8/1981 | delRio |
| 4,284,682 A | 8/1981 | Frosch et al. |
| 4,287,473 A | 9/1981 | Sawyer |
| 4,342,958 A | 8/1982 | Russell |
| 4,346,355 A | 8/1982 | Tsukii |
| 4,352,061 A | 9/1982 | Matrone |
| 4,357,575 A | 11/1982 | Uren et al. |
| 4,365,109 A | 12/1982 | O'Loughlin |
| 4,365,195 A | 12/1982 | Stegens |
| 4,371,742 A | 2/1983 | Manly |
| 4,376,920 A | 3/1983 | Smith |
| 4,383,178 A | 5/1983 | Shibata et al. |
| 4,414,638 A | 11/1983 | Talambrias |
| 4,419,626 A | 12/1983 | Cedrone et al. |
| 4,425,395 A | 1/1984 | Negishi et al. |
| 4,426,619 A | 1/1984 | Demand |
| 4,473,798 A | 9/1984 | Cedrone et al. |
| 4,479,690 A | 10/1984 | Inouye et al. |
| 4,480,223 A | 10/1984 | Aigo |
| 4,487,996 A | 12/1984 | Rabinowitz et al. |
| 4,491,173 A | 1/1985 | Demand |
| 4,503,335 A | 3/1985 | Takahashi |
| 4,507,602 A | 3/1985 | Aguirre |
| 4,528,504 A | 7/1985 | Thornton, Jr. et al. |
| 4,531,474 A | 7/1985 | Inuta |
| 4,532,423 A | 7/1985 | Tojo et al. |
| 4,557,599 A | 12/1985 | Zimring |
| 4,566,184 A | 1/1986 | Higgins et al. |
| 4,567,321 A | 1/1986 | Harayama |
| 4,567,908 A | 2/1986 | Bolsterli |
| 4,575,676 A | 3/1986 | Palkuti |
| 4,588,970 A | 5/1986 | Donecker et al. |
| 4,621,169 A | 11/1986 | Petinelli et al. |
| 4,626,618 A | 12/1986 | Takaoka et al. |
| 4,642,417 A | 2/1987 | Ruthrof et al. |
| 4,646,005 A | 2/1987 | Ryan |
| 4,665,360 A | 5/1987 | Phillips |
| 4,673,839 A | 6/1987 | Veenendaal |
| 4,675,600 A | 6/1987 | Gergin |
| 4,680,538 A | 7/1987 | Dalman et al. |
| 4,684,883 A | 8/1987 | Ackerman et al. |
| 4,691,831 A | 9/1987 | Suzuki et al. |
| 4,694,245 A | 9/1987 | Frommes |
| 4,695,794 A | 9/1987 | Bargett et al. |
| 4,697,143 A | 9/1987 | Lockwood et al. |
| 4,703,433 A | 10/1987 | Sharrit |
| 4,711,563 A | 12/1987 | Lass |
| 4,712,370 A | 12/1987 | MacGee |
| 4,727,637 A | 3/1988 | Buckwitz et al. |
| 4,730,158 A | 3/1988 | Kasai et al. |
| 4,731,577 A | 3/1988 | Logan |
| 4,734,872 A | 3/1988 | Eager et al. |
| 4,739,259 A | 4/1988 | Hadwin et al. |
| 4,744,041 A | 5/1988 | Strunk et al. |
| 4,755,746 A | 7/1988 | Mallory et al. |
| 4,755,874 A | 7/1988 | Esrig et al. |
| 4,757,255 A | 7/1988 | Margozzi |
| 4,758,785 A | 7/1988 | Rath |
| 4,759,712 A | 7/1988 | Demand |
| 4,771,234 A | 9/1988 | Cook et al. |
| 4,772,846 A | 9/1988 | Reeds |
| 4,777,434 A | 10/1988 | Miller et al. |
| 4,783,625 A | 11/1988 | Harry et al. |
| 4,784,213 A | 11/1988 | Eager et al. |
| 4,786,867 A | 11/1988 | Yamatsu |
| 4,787,752 A | 11/1988 | Fraser et al. |
| 4,791,363 A | 12/1988 | Logan |
| 4,810,981 A | 3/1989 | Herstein |
| 4,812,754 A | 3/1989 | Tracy et al. |
| 4,816,767 A | 3/1989 | Cannon et al. |
| 4,818,169 A | 4/1989 | Schram et al. |
| 4,827,211 A | 5/1989 | Strid et al. |
| 4,838,802 A | 6/1989 | Soar |
| 4,839,587 A | 6/1989 | Flatley et al. |
| 4,845,426 A | 7/1989 | Nolan et al. |
| 4,849,689 A | 7/1989 | Gleason |
| 4,853,613 A | 8/1989 | Sequeira et al. |
| 4,856,426 A | 8/1989 | Wirz |
| 4,856,904 A | 8/1989 | Akagawa |
| 4,858,160 A | 8/1989 | Strid et al. |
| 4,859,989 A | 8/1989 | McPherson |
| 4,871,883 A | 10/1989 | Guiol |
| 4,871,965 A | 10/1989 | Elbert et al. |
| 4,884,026 A | 11/1989 | Hayakawa et al. |
| 4,884,206 A | 11/1989 | Mate |
| 4,888,550 A | 12/1989 | Reid |
| 4,893,914 A | 1/1990 | Hancock et al. |
| 4,894,612 A | 1/1990 | Drake et al. |
| 4,896,109 A | 1/1990 | Rauscher |
| 4,899,998 A | 2/1990 | Teramachi |
| 4,904,933 A | 2/1990 | Snyder et al. |
| 4,904,935 A | 2/1990 | Calma et al. |
| 4,906,920 A | 3/1990 | Huff et al. |
| 4,916,398 A | 4/1990 | Rath |
| 4,918,279 A | 4/1990 | Babel et al. |
| 4,918,374 A | 4/1990 | Stewart et al. |
| 4,923,407 A | 5/1990 | Rice et al. |
| 4,926,118 A | 5/1990 | O'Connor et al. |
| 4,933,634 A | 6/1990 | Cuzin et al. |
| 4,968,931 A | 11/1990 | Littlebury et al. |
| 4,978,907 A | 12/1990 | Smith |
| 4,978,914 A | 12/1990 | Akimoto et al. |
| 4,982,153 A | 1/1991 | Collins et al. |
| 4,994,737 A | 2/1991 | Carlton et al. |
| 5,001,423 A | 3/1991 | Abrami et al. |
| 5,006,796 A | 4/1991 | Burton et al. |
| 5,010,296 A | 4/1991 | Okada et al. |

| | | | | | |
|---|---|---|---|---|---|
| 5,019,692 A | 5/1991 | Nbedi et al. | 5,486,975 A | 1/1996 | Shamouilian et al. |
| 5,030,907 A | 7/1991 | Yih et al. | 5,488,954 A | 2/1996 | Sleva et al. |
| 5,034,688 A | 7/1991 | Moulene et al. | 5,491,426 A | 2/1996 | Small |
| 5,041,782 A | 8/1991 | Marzan | 5,493,070 A | 2/1996 | Habu |
| 5,045,781 A | 9/1991 | Gleason et al. | 5,493,236 A | 2/1996 | Ishii et al. |
| 5,061,823 A | 10/1991 | Carroll | 5,500,606 A | 3/1996 | Holmes |
| 5,065,089 A | 11/1991 | Rich | 5,506,515 A | 4/1996 | Godshalk et al. |
| 5,065,092 A | 11/1991 | Sigler | 5,508,631 A | 4/1996 | Manku et al. |
| 5,066,357 A | 11/1991 | Smyth, Jr. et al. | 5,510,792 A | 4/1996 | Ono et al. |
| 5,070,297 A | 12/1991 | Kwon et al. | 5,511,010 A | 4/1996 | Burns |
| 5,077,523 A | 12/1991 | Blanz | 5,515,167 A | 5/1996 | Ledger et al. |
| 5,084,671 A | 1/1992 | Miyata et al. | 5,517,111 A | 5/1996 | Shelor |
| 5,089,774 A | 2/1992 | Nakano | 5,521,522 A | 5/1996 | Abe et al. |
| 5,091,691 A | 2/1992 | Kamieniecki et al. | 5,523,694 A | 6/1996 | Cole, Jr. |
| 5,095,891 A | 3/1992 | Reitter | 5,530,371 A | 6/1996 | Perry et al. |
| 5,097,207 A | 3/1992 | Blanz | 5,530,372 A | 6/1996 | Lee et al. |
| 5,101,149 A | 3/1992 | Adams et al. | 5,532,609 A | 7/1996 | Harwood et al. |
| 5,101,453 A | 3/1992 | Rumbaugh | 5,539,323 A | 7/1996 | Davis, Jr. |
| 5,103,169 A | 4/1992 | Heaton et al. | 5,546,012 A | 8/1996 | Perry et al. |
| 5,105,148 A | 4/1992 | Lee | 5,550,480 A | 8/1996 | Nelson et al. |
| 5,105,181 A | 4/1992 | Ross | 5,550,482 A | 8/1996 | Sano |
| 5,107,076 A | 4/1992 | Bullock et al. | 5,552,716 A | 9/1996 | Takahashi et al. |
| 5,142,224 A | 8/1992 | Smith et al. | 5,561,377 A | 10/1996 | Strid et al. |
| 5,144,228 A | 9/1992 | Sorna et al. | 5,561,585 A | 10/1996 | Barnes et al. |
| 5,159,752 A | 11/1992 | Mahant-Shetti et al. | 5,565,788 A | 10/1996 | Burr et al. |
| 5,160,883 A | 11/1992 | Blanz | 5,571,324 A | 11/1996 | Sago et al. |
| 5,164,661 A | 11/1992 | Jones | 5,572,398 A | 11/1996 | Federlin et al. |
| 5,166,606 A | 11/1992 | Blanz | 5,583,445 A | 12/1996 | Mullen |
| 5,172,049 A | 12/1992 | Kiyokawa et al. | 5,594,358 A | 1/1997 | Ishikawa et al. |
| 5,198,752 A | 3/1993 | Miyata et al. | 5,604,444 A | 2/1997 | Harwood et al. |
| 5,198,753 A | 3/1993 | Hamburgen | 5,610,529 A | 3/1997 | Schwindt |
| 5,198,756 A | 3/1993 | Jenkins et al. | 5,611,946 A | 3/1997 | Leong et al. |
| 5,198,758 A | 3/1993 | Iknaian et al. | 5,617,035 A | 4/1997 | Swapp |
| 5,202,558 A | 4/1993 | Barker | 5,629,631 A | 5/1997 | Perry et al. |
| 5,209,088 A | 5/1993 | Vaks | 5,631,571 A | 5/1997 | Spaziani et al. |
| 5,210,485 A | 5/1993 | Kreiger et al. | 5,640,101 A | 6/1997 | Kuji et al. |
| 5,214,243 A | 5/1993 | Johnson | 5,646,538 A | 7/1997 | Lide et al. |
| 5,214,374 A | 5/1993 | St. Onge | 5,657,394 A | 8/1997 | Schwartz et al. |
| 5,218,185 A | 6/1993 | Gross | 5,659,255 A | 8/1997 | Strid et al. |
| 5,220,277 A | 6/1993 | Reitinger | 5,663,653 A | 9/1997 | Schwindt et al. |
| 5,221,905 A | 6/1993 | Bhangu et al. | 5,666,063 A | 9/1997 | Abercrombie et al. |
| 5,225,037 A | 7/1993 | Elder et al. | 5,668,470 A | 9/1997 | Shelor |
| 5,225,796 A | 7/1993 | Williams et al. | 5,669,316 A | 9/1997 | Faz et al. |
| 5,237,267 A | 8/1993 | Harwood et al. | 5,670,888 A | 9/1997 | Cheng |
| 5,266,889 A | 11/1993 | Harwood et al. | 5,675,499 A | 10/1997 | Lee et al. |
| 5,278,494 A | 1/1994 | Obigane | 5,675,932 A | 10/1997 | Mauney |
| 5,280,156 A | 1/1994 | Niori et al. | 5,676,360 A | 10/1997 | Boucher et al. |
| 5,303,938 A | 4/1994 | Miller et al. | 5,680,039 A | 10/1997 | Mochizuki et al. |
| 5,315,237 A | 5/1994 | Iwakura et al. | 5,682,337 A | 10/1997 | El-Fishawy et al. |
| 5,321,352 A | 6/1994 | Takebuchi | 5,685,232 A | 11/1997 | Inoue |
| 5,325,052 A | 6/1994 | Yamashita | 5,712,571 A | 1/1998 | O'Donoghue |
| 5,334,931 A | 8/1994 | Clarke et al. | 5,729,150 A | 3/1998 | Schwindt |
| 5,336,989 A | 8/1994 | Hofer | 5,731,708 A | 3/1998 | Sobhami |
| 5,345,170 A | 9/1994 | Schwindt et al. | 5,773,951 A | 6/1998 | Markowski et al. |
| 5,369,370 A | 11/1994 | Stratmann et al. | 5,777,485 A | 7/1998 | Tanaka et al. |
| 5,371,457 A | 12/1994 | Lipp | 5,798,652 A | 8/1998 | Taraci |
| 5,373,231 A | 12/1994 | Boll et al. | 5,802,856 A | 9/1998 | Schaper et al. |
| 5,382,898 A | 1/1995 | Subramanian | 5,804,982 A | 9/1998 | Lo et al. |
| 5,397,855 A | 3/1995 | Ferlier | 5,804,983 A | 9/1998 | Nakajima et al. |
| 5,404,111 A | 4/1995 | Mori et al. | 5,807,107 A | 9/1998 | Bright et al. |
| 5,408,189 A | 4/1995 | Swart et al. | 5,811,751 A | 9/1998 | Leong et al. |
| 5,410,259 A | 4/1995 | Fujihara et al. | 5,828,225 A | 10/1998 | Obikane et al. |
| 5,422,574 A | 6/1995 | Kister | 5,831,442 A | 11/1998 | Heigl |
| 5,434,512 A | 7/1995 | Schwindt et al. | 5,835,997 A | 11/1998 | Yassine |
| 5,451,884 A | 9/1995 | Sauerland | 5,838,161 A | 11/1998 | Akram et al. |
| 5,457,398 A | 10/1995 | Schwindt et al. | 5,847,569 A | 12/1998 | Ho et al. |
| 5,461,328 A | 10/1995 | Devereaux et al. | 5,848,500 A | 12/1998 | Kirk |
| 5,469,324 A | 11/1995 | Henderson et al. | 5,857,667 A | 1/1999 | Lee |
| 5,475,316 A | 12/1995 | Hurley et al. | 5,861,743 A | 1/1999 | Pye et al. |
| 5,477,011 A | 12/1995 | Singles et al. | 5,869,975 A | 2/1999 | Strid et al. |
| 5,479,108 A | 12/1995 | Cheng | 5,874,361 A | 2/1999 | Collins et al. |
| 5,479,109 A | 12/1995 | Lau et al. | 5,879,289 A | 3/1999 | Yarush et al. |
| 5,481,936 A | 1/1996 | Yanagisawa | 5,883,522 A | 3/1999 | O'Boyle |

| | | | | | | |
|---|---|---|---|---|---|---|
| 5,883,523 | A | 3/1999 | Ferland et al. | 6,300,775 B1 | 10/2001 | Peach et al. |
| 5,892,539 | A | 4/1999 | Colvin | 6,310,755 B1 | 10/2001 | Kholodenko et al. |
| 5,900,737 | A | 5/1999 | Graham et al. | 6,313,649 B2 | 11/2001 | Harwood et al. |
| 5,903,143 | A | 5/1999 | Mochizuki et al. | 6,320,372 B1 | 11/2001 | Keller |
| 5,910,727 | A | 6/1999 | Fujihara et al. | 6,320,396 B1 | 11/2001 | Nikawa |
| 5,916,689 | A | 6/1999 | Collins et al. | 6,335,628 B2 | 1/2002 | Schwindt et al. |
| 5,923,177 | A | 7/1999 | Wardwell | 6,362,636 B1 | 3/2002 | Peters et al. |
| 5,942,907 | A | 8/1999 | Chiang | 6,380,751 B2 | 4/2002 | Harwood et al. |
| 5,945,836 | A | 8/1999 | Sayre et al. | 6,396,296 B1 | 5/2002 | Tarter et al. |
| 5,949,579 | A | 9/1999 | Baker | 6,407,560 B1 | 6/2002 | Walraven et al. |
| 5,952,842 | A | 9/1999 | Fujimoto | 6,424,141 B1 | 7/2002 | Hollman et al. |
| 5,959,461 | A | 9/1999 | Brown et al. | 6,445,202 B1 | 9/2002 | Cowan et al. |
| 5,960,411 | A | 9/1999 | Hartman et al. | 6,480,013 B1 | 11/2002 | Nayler et al. |
| 5,963,027 | A | 10/1999 | Peters | 6,483,327 B1 | 11/2002 | Bruce et al. |
| 5,963,364 | A | 10/1999 | Leong et al. | 6,483,336 B1 | 11/2002 | Harris et al. |
| 5,973,505 | A | 10/1999 | Strid et al. | 6,486,687 B2 | 11/2002 | Harwood et al. |
| 5,982,166 | A | 11/1999 | Mautz | 6,488,405 B1 | 12/2002 | Eppes et al. |
| 5,995,914 | A | 11/1999 | Cabot | 6,489,789 B2 | 12/2002 | Peters et al. |
| 5,998,768 | A | 12/1999 | Hunter et al. | 6,492,822 B2 | 12/2002 | Schwindt et al. |
| 5,999,268 | A | 12/1999 | Yonezawa et al. | 6,501,289 B1 | 12/2002 | Takekoshi |
| 6,001,760 | A | 12/1999 | Katsuda et al. | 6,549,022 B1 | 4/2003 | Cole, Jr. et al. |
| 6,002,263 | A | 12/1999 | Peters et al. | 6,549,026 B1 | 4/2003 | Dibattista et al. |
| 6,002,426 | A | 12/1999 | Back et al. | 6,549,106 B2 | 4/2003 | Martin |
| 6,013,586 | A | 1/2000 | McGhee et al. | 6,573,702 B2 | 6/2003 | Marcuse et al. |
| 6,023,209 | A * | 2/2000 | Faulkner et al. ............ 333/238 | 6,605,951 B1 | 8/2003 | Cowan |
| 6,028,435 | A | 2/2000 | Nikawa | 6,605,955 B1 | 8/2003 | Costello et al. |
| 6,029,141 | A | 2/2000 | Bezos et al. | 6,608,494 B1 | 8/2003 | Bruce et al. |
| 6,031,383 | A | 2/2000 | Streib et al. | 6,608,496 B1 | 8/2003 | Strid et al. |
| 6,034,533 | A | 3/2000 | Tervo et al. | 6,617,862 B1 | 9/2003 | Bruce |
| 6,037,785 | A | 3/2000 | Higgins | 6,621,082 B2 | 9/2003 | Morita et al. |
| 6,037,793 | A | 3/2000 | Miyazawa et al. | 6,624,891 B2 | 9/2003 | Marcus et al. |
| 6,043,667 | A | 3/2000 | Cadwallader et al. | 6,633,174 B1 | 10/2003 | Satya et al. |
| 6,049,216 | A | 4/2000 | Yang et al. | 6,636,059 B2 | 10/2003 | Harwood et al. |
| 6,052,653 | A | 4/2000 | Mazur et al. | 6,639,415 B2 | 10/2003 | Peters et al. |
| 6,054,869 | A | 4/2000 | Hutton et al. | 6,642,732 B2 | 11/2003 | Cowan et al. |
| 6,060,888 | A | 5/2000 | Blackham et al. | 6,643,597 B1 | 11/2003 | Dunsmore |
| 6,060,891 | A | 5/2000 | Hembree et al. | 6,686,753 B1 | 2/2004 | Kitahata |
| 6,078,183 | A | 6/2000 | Cole, Jr. | 6,701,265 B2 | 3/2004 | Hill et al. |
| 6,091,236 | A | 7/2000 | Piety et al. | 6,710,798 B1 | 3/2004 | Hershel et al. |
| 6,091,255 | A | 7/2000 | Godfrey | 6,720,782 B2 | 4/2004 | Schwindt et al. |
| 6,096,567 | A | 8/2000 | Kaplan et al. | 6,724,205 B1 | 4/2004 | Hayden et al. |
| 6,104,203 | A | 8/2000 | Costello et al. | 6,724,928 B1 | 4/2004 | Davis |
| 6,111,419 | A | 8/2000 | Lefever et al. | 6,734,687 B1 | 5/2004 | Ishitani et al. |
| 6,114,865 | A | 9/2000 | Lagowski et al. | 6,744,268 B2 | 6/2004 | Hollman |
| 6,118,894 | A | 9/2000 | Schwartz et al. | 6,771,090 B2 | 8/2004 | Harris et al. |
| 6,121,783 | A | 9/2000 | Horner et al. | 6,771,806 B1 | 8/2004 | Satya et al. |
| 6,124,723 | A | 9/2000 | Costello | 6,774,651 B1 | 8/2004 | Hembree |
| 6,124,725 | A | 9/2000 | Sato | 6,777,964 B2 | 8/2004 | Navratil et al. |
| 6,127,831 | A | 10/2000 | Khoury et al. | 6,788,093 B2 | 9/2004 | Aitren et al. |
| 6,130,544 | A | 10/2000 | Strid et al. | 6,791,344 B2 | 9/2004 | Cook et al. |
| 6,137,302 | A | 10/2000 | Schwindt | 6,801,047 B2 | 10/2004 | Harwood et al. |
| 6,137,303 | A | 10/2000 | Deckert et al. | 6,806,724 B2 | 10/2004 | Hayden et al. |
| 6,144,212 | A | 11/2000 | Mizuta | 6,836,135 B2 | 12/2004 | Harris et al. |
| 6,147,851 | A | 11/2000 | Anderson | 6,838,885 B2 | 1/2005 | Kamitani |
| 6,160,407 | A | 12/2000 | Nikawa | 6,842,024 B2 | 1/2005 | Peters et al. |
| 6,194,907 | B1 | 2/2001 | Kanao et al. | 6,843,024 B2 | 1/2005 | Nozaki et al. |
| 6,198,299 | B1 | 3/2001 | Hollman | 6,847,219 B1 | 1/2005 | Lesher et al. |
| 6,211,663 | B1 | 4/2001 | Moulthrop et al. | 6,856,129 B2 | 2/2005 | Thomas et al. |
| 6,222,970 | B1 | 4/2001 | Wach et al. | 6,861,856 B2 | 3/2005 | Dunklee et al. |
| 6,232,787 | B1 | 5/2001 | Lo et al. | 6,873,167 B2 | 3/2005 | Goto et al. |
| 6,232,788 | B1 | 5/2001 | Schwindt et al. | 6,885,197 B2 | 4/2005 | Harris et al. |
| 6,232,789 | B1 | 5/2001 | Schwindt | 6,900,646 B2 | 5/2005 | Kasukabe et al. |
| 6,232,790 | B1 | 5/2001 | Bryan et al. | 6,900,647 B2 | 5/2005 | Yoshida et al. |
| 6,236,975 | B1 | 5/2001 | Boe et al. | 6,900,652 B2 | 5/2005 | Mazur |
| 6,236,977 | B1 | 5/2001 | Verba et al. | 6,900,653 B2 | 5/2005 | Yu et al. |
| 6,245,692 | B1 | 6/2001 | Pearce et al. | 6,902,941 B2 | 6/2005 | Sun |
| 6,252,392 | B1 | 6/2001 | Peters | 6,903,563 B2 | 6/2005 | Yoshida et al. |
| 6,257,319 | B1 | 7/2001 | Kainuma et al. | 6,927,079 B1 | 8/2005 | Fyfield |
| 6,259,261 | B1 | 7/2001 | Engelking et al. | 7,001,785 B1 | 2/2006 | Chen |
| 6,271,673 | B1 | 8/2001 | Furuta et al. | 7,002,133 B2 | 2/2006 | Beausoleil et al. |
| 6,284,971 | B1 | 9/2001 | Atalar et al. | 7,002,363 B2 | 2/2006 | Mathieu |
| 6,288,557 | B1 | 9/2001 | Peters et al. | 7,002,364 B2 | 2/2006 | Kang et al. |
| 6,292,760 | B1 | 9/2001 | Burns | 7,003,184 B2 | 2/2006 | Ronnekleiv et al. |

| | | | | | | |
|---|---|---|---|---|---|---|
| 7,005,842 | B2 | 2/2006 | Fink et al. | DE | 43 16 111 | 11/1994 |
| 7,005,868 | B2 | 2/2006 | McTigue | DE | 195 41 334 | 9/1996 |
| 7,005,879 | B1 | 2/2006 | Robertazzi | DE | 196 16 212 | 10/1996 |
| 7,006,046 | B2 | 2/2006 | Aisenbrey | DE | 196 18 717 | 1/1998 |
| 7,007,380 | B2 | 3/2006 | Das et al. | DE | 693 22 206 | 4/1999 |
| 7,009,188 | B2 | 3/2006 | Wang | EP | 0 087 497 | 9/1983 |
| 7,009,383 | B2 | 3/2006 | Harwood et al. | EP | 0 201 205 | 12/1986 |
| 7,009,415 | B2 | 3/2006 | Kobayashi et al. | EP | 0 314 481 | 5/1989 |
| 7,011,531 | B2 | 3/2006 | Egitto et al. | EP | 0 333 521 | 9/1989 |
| 7,012,425 | B2 | 3/2006 | Shoji | EP | 0 460 911 | 12/1991 |
| 7,012,441 | B2 | 3/2006 | Chou et al. | EP | 0 505 981 | 9/1992 |
| 7,013,221 | B1 | 3/2006 | Friend et al. | EP | 0 574 149 | 12/1993 |
| 7,014,499 | B2 | 3/2006 | Yoon | EP | 0 706 210 | 4/1996 |
| 7,015,455 | B2 | 3/2006 | Mitsuoka et al. | EP | 0 573 183 | 1/1999 |
| 7,015,689 | B2 | 3/2006 | Kasajima et al. | GB | 2 197 081 | 5/1988 |
| 7,015,690 | B2 | 3/2006 | Wang et al. | JP | 53-052354 | 5/1978 |
| 7,015,703 | B2 | 3/2006 | Hopkins et al. | JP | 56-007439 | 1/1981 |
| 7,015,707 | B2 | 3/2006 | Cherian | JP | 62-011243 | 1/1987 |
| 7,015,708 | B2 | 3/2006 | Beckous et al. | JP | 63-143814 | 6/1988 |
| 7,015,709 | B2 | 3/2006 | Capps et al. | JP | 63-160355 | 7/1988 |
| 7,015,710 | B2 | 3/2006 | Yoshida et al. | JP | 1-165968 | 6/1989 |
| 7,015,711 | B2 | 3/2006 | Rothaug et al. | JP | 1-178872 | 7/1989 |
| 7,019,541 | B2 | 3/2006 | Kittrell | JP | 1-209380 | 8/1989 |
| 7,019,544 | B1 | 3/2006 | Jacobs et al. | JP | 1-214038 | 8/1989 |
| 7,020,360 | B2 | 3/2006 | Satomura et al. | JP | 1-219575 | 9/1989 |
| 7,020,363 | B2 | 3/2006 | Johannessen | JP | 1-296167 | 11/1989 |
| 7,022,976 | B1 | 4/2006 | Santana, Jr. et al. | JP | 2-22837 | 1/1990 |
| 7,022,985 | B2 | 4/2006 | Knebel et al. | JP | 2-22873 | 1/1990 |
| 7,023,225 | B2 | 4/2006 | Blackwood | JP | 2-220453 | 9/1990 |
| 7,023,226 | B2 | 4/2006 | Okumura et al. | JP | 3-67187 | 3/1991 |
| 7,023,229 | B2 | 4/2006 | Maesaki et al. | JP | 3-175367 | 7/1991 |
| 7,023,231 | B2 | 4/2006 | Howland, Jr. et al. | JP | 4-732 | 1/1992 |
| 7,025,628 | B2 | 4/2006 | LaMeres et al. | JP | 5-157790 | 6/1993 |
| 7,026,832 | B2 | 4/2006 | Chaya et al. | JP | 5-166893 | 7/1993 |
| 7,026,833 | B2 | 4/2006 | Rincon et al. | JP | 60-71425 | 3/1994 |
| 7,026,834 | B2 | 4/2006 | Hwang | JP | 7-5197 | 1/1995 |
| 7,026,835 | B2 | 4/2006 | Farnworth et al. | JP | 7005078 | 1/1995 |
| 7,030,599 | B2 | 4/2006 | Douglas | JP | 7-273509 | * 10/1995 |
| 7,032,307 | B2 | 4/2006 | Matsunaga et al. | JP | 10-116866 | 5/1998 |
| 7,034,553 | B2 | 4/2006 | Gilboe | JP | 10-339743 | 12/1998 |
| 7,035,738 | B2 | 4/2006 | Matsumoto et al. | JP | 11-031724 | 2/1999 |
| 7,101,797 | B2 | 9/2006 | Yuasa | JP | 2001-189285 | 7/2001 |
| 2001/0009377 | A1 | 7/2001 | Schwindt et al. | JP | 2001-189378 | 7/2001 |
| 2001/0010468 | A1 | 8/2001 | Gleason et al. | JP | 2002033374 | 1/2002 |
| 2001/0020283 | A1 | 9/2001 | Sakaguchi | JP | 2002-164396 | 6/2002 |
| 2001/0030549 | A1 | 10/2001 | Gleason et al. | WO | WO 80/00101 | 1/1980 |
| 2002/0075027 | A1 | 6/2002 | Hollman et al. | WO | WO 86/07493 | * 12/1986 |
| 2002/0118009 | A1 | 8/2002 | Hollman et al. | WO | WO 89/04001 | 5/1989 |
| 2003/0062915 | A1 | 4/2003 | Arnold et al. | WO | WO 01/69656 | 9/2001 |
| 2003/0071631 | A1 | 4/2003 | Alexander | WO | WO 2004/049395 | 6/2004 |
| 2003/0141861 | A1 | 7/2003 | Navratil et al. | | | |
| 2004/0061514 | A1 | 4/2004 | Schwindt et al. | | | |
| 2004/0095145 | A1 | 5/2004 | Boudial et al. | | | |
| 2004/0100276 | A1 | 5/2004 | Fanton | | | |
| 2004/0113639 | A1 | 6/2004 | Dunklee et al. | | | |
| 2004/0162689 | A1 | 8/2004 | Jamneala et al. | | | |
| 2004/0193382 | A1 | 9/2004 | Adamian et al. | | | |
| 2004/0199350 | A1 | 10/2004 | Blackham et al. | | | |
| 2004/0207424 | A1 | 10/2004 | Hollman | | | |
| 2004/0251922 | A1 | 12/2004 | Martens et al. | | | |
| 2005/0024069 | A1 | 2/2005 | Hayden et al. | | | |
| 2005/0099192 | A1 | 5/2005 | Dunklee et al. | | | |
| 2005/0227503 | A1 | 10/2005 | Reitinger | | | |
| 2006/0114012 | A1 | 6/2006 | Reitinger | | | |
| 2006/0158207 | A1 | 7/2006 | Reitinger | | | |

FOREIGN PATENT DOCUMENTS

| | | |
|---|---|---|
| DE | 31 14 466 | 3/1982 |
| DE | 31 25 552 | 11/1982 |
| DE | 288 234 | 9/1989 |
| DE | 41 09 908 | 10/1992 |
| DE | 94 06 227 | 4/1994 |

OTHER PUBLICATIONS

Christophe Risacher, Vessen Vassilev, Alexey Pavolotsky, and Victor Belitsky, "Waveguide-to-Microstrip Transition With Integrated Bias-T," IEEE Microwave and Wireless Components Letters, vol. 13, No. 7, Jul. 2003, pp. 262-264.

John A. Modolo, Gordon Wood Anderson, Francis J. Kub, and Ingham A.G. Mack, "Wafer level high-frequency measurements of photodetector characteristics," Applied Optics, vol. 27, No. 15, Aug. 1, 1988, pp. 3059-3060.

Cascade Microtech, "Introducing the peak of analytical probe stations," MicroProbe Update, May 1990.

H.-J. Eul and B. Schiek, "Thru-Match-Reflect: One Result of a Rigorous Theory for De-Embedding and Network Analyzer Calibration," 18th Euopean Microwave Conference '88, The International Conference Designed for the Microwave Community, Published by Microwave Exhibitions and Publishers Limited, Sep. 12-16, 1988, Stockholm, Sweden.

Cascade Microtech, "Analytical Probe Station," Summit 9000 Series, Jun. 1, 1990.

Maury Microwave Corporation, "MT950D Series, Transistor Test Fixture Software, Software Application Packs," Sep. 20, 1982.

Eric Phizicky, Philippe I.H. Bastiaens, Heng Zhu, Michael Snyder, & Stanley Fields, "Protein analysis on a proteomic scale," Nature 422, insight: review article, Mar. 13, 2003.

Brian J. Clifton, "Precision slotted-Line Impedance Measurements Using computer Simulation for Data Correction," IEEE Transactions on Instrumentation and Measurement, vol. IM-19, No. 4, Nov. 1970, pp. 358-363.

Eric Strid (Cascade Microtech), "Planar Impedance Standards and Accuracy Considerations in Vector Network Analysis," Jun. 1986, 8 pages.

Maury Microwave Corporation, "MT950 Series Transistor Test Fixture (TTF) Noticei Noticei Noticei," May 31, 1985.

Maury Microwave Corporation, MT950 Series Transistor Test Fixture (TTF), Oct. 7, 1982, 4 pages.

Temptronic Corporation, "Model TPO3000 Series ThermoChuck Systems for Probing, Characterization and Failure analysis of Wafers, Chips and Hybrids at High and Low Temperatures," pp. 2-5.

Design Technique, "Microstrip Microwave Test Fixture," May 1986, 2 pages.

PHOTO: Micromanipulator Probe Station 1994.

Micromanipulator Sales and Services Inc., "Test Station Accessories," Copyright 1983, 1984, 1 page.

Ruedi Aebersold & Matthias Mann, "Insight Review Articles, Mass spectrometry-based proteomics," Nature, vol. 422, Mar. 13, 2003, pp. 198-207.

Keithley Instruments, Inc. "Low-Level Measurements for Effective Low Current, Low Voltage, and High Impedance Measurements," Revised Third Edition, Printed Jun. 1984.

Inter-Continental Microwave, 2370-B Walsh Avenue, Santa Clara, CA 95051, "Product Catalog," Jan. 1986.

Hewlett Packard, "HP 4284A Precision LCR Meter Operation Manual (Including Option 001,002,006,201,202,301)," Third Edition, Dec. 1991, pp. 2-1, 6-9, 6-15.

Cletus A Hoer, "A High-Power Dual Six-Port Automatic Network Analyzer Used in Determining Biological Effects of RF and Microwave Radiation," IEEE Transactions on Microwave Theory and Techniques, vol. MTT-29, No. 12, Dec. 1981.

Cascade Microtech Technical Brief, A Guide to Better Vector Network Analyzer Calibrations for Probe-Tip Measurements, Copyright 1994, 2 pages.

TEMPTRONIC, "Guarded" Chuck Sketch, Nov. 15, 1989.

Andrej Sali, Robert Glaeser, Thomas Earnest & Wolfgang Baumeister, "From words to literature in structural proteomics," Insight: Review Article, Nature 422, pp. 216-225, Mar. 13, 2003.

Mike Tyers & Matthias Mann, "From genomics to proteomics," Insight overview, Nature vol. 422 Mar. 2003, pp. 193-197.

William Knauer, "Fixturing for Low-Current/Low-Voltage Parametric Testing," Evaluation Engineering, Nov. 1990, pp. 9-12.

J.D.Tompkins, "Evaluating High Speed AC Testers," IBM Technical Disclosure Bulletin, vol. 13, No. 7 Dec. 1970, p. 180.

Jim Fitzpatrick, "Error Models for Systems Measurement," Microwave Journal, May 1978, pp. 63-66.

Sam Hanash, "Disease proteomics," Insight Review Articles, Nature, vol. 422, Mar. 13, 2003, pp. 226-232.

Design Technique International, "Adjustable Test Fixture," Copyright 1988.

Ronald F. Bauer & Paul Penfield, Jr., "De-Embedding and Unterminating," IEEE Transactions on Microwave Theory and Techniques, vol. MTT-22, No. 3, Mar. 1974, pp. 282-288.

Cross Section—Signatone S-1240 Sketch, Advertised & Sold 1987-1988.

Yousuke Yamamoto, "A Compact Self-Shielding Prober for Accurate Measurement of On-Wafer Electron Devices," IEEE Transactions on Instrumentation and Measurement, vol. 38, No. 6, Dec. 1989, pp. 1088-1093.

R. Y. Koyama & M. G. Buehler, "Semiconductor Measurement Technology: A Wafer Chuck for Use Between −196 and 350° C.," U.S. Department of Commerce, National Technical Information Service, PB-293 298, Issued Jan. 1979.

Ken Cole, "ThermoChuck Performance (Fax)," 2 pages, Mar. 10, 1995.

S. Beck & E. Tomann, "Chip Tester," IBM Technical Disclosure Bulletin, Jan. 1985.

L. L. Sohn, O. A. Saleh, G. R. Facer, A. J. Beavis, R. S. Allan, & D.A. Notterman, "Capacitance Cytometry: Measuring biological cells one by one," PNAS vol. 97, No. 20 Sep. 26, 2000, pp. 10687-10690.

Mark S. Boguski & Matin W. McIntosh, "Biomedical informatics for proteomics," Insight: review article, Nature 422, Mar. 13, 2003, pp. 233-237.

The Micromanipulator Company, Inc., "Model 8000 Test Station," 1986, 1 page.

The Micromanipulator Company, Inc. "Model 8000 Test Station," 1988, 1 page.

Microwave Products, Microwave Journal, Sep. 1988, 1 page.

Saswata Basu & Leonard Hayden, "An SOLR Calibration for Accurate Measurement of Orthogonal On-Wafer Duts," IEEE MTT-S Digest, 1997, pp. 1335-1336, 1338.

Hewlett Packard, "HP 4142B Modular DC source/Monitor Practical Applications—High Speed DC Characterization of Semiconductor Devices from Sub pA to 1A," Nov. 1987, pp. 1-4.

*Cascade Microtech, Inc.* vs *Micromanipulator Company, Inc.*, "Deposition of Harry F. Applebay," United States District Court for the District of Oregon, Lead Case No. 97-479-A1, May 13, 1998.

Flexion Corporation, "Cryotest Station MP-3," *Cascade Microtech, Inc.* vs. *Micromanipulator Company, Inc.*, Applebay Exhibit 576, May 13, 1998, 68 pages.

Flexion Corporation, "Cryotest Station MP-3," *Cascade Microtech, Inc.* vs. *Micromanipulator Company, Inc.*, Applebay Exhibit 578, May 13, 1998, 1 page.

*Cascade Microtech, Inc.* vs. *Micromanipulator Company, Inc.*, Applebay Exhibit 572, May 13, 1998, 2 pages.

*Cascade Microtech, Inc.* vs. *Micromanipulator Company, Inc.*, Applebay Exhibits 581A, 581B, and 581C, May 13, 1998, 3 pages.

Flexion Corporation, "AP-1 Cryotest Station," Applebay Exhibit 582, May 13, 1998, 20 pages.

Flexion Corporation, "AP-1 Cryotest Station User Manual," Applebay Exhibit 583, May 13, 1998, 187 pages.

*Cascade Microtech, Inc.* vs. *Micromanipulator Company, Inc.*, Applebay Exhibits 577A, 577B, 577C, May 13, 1998, 3 pages.

*Cascade Microtech, Inc.* vs. *Micromanipulator Company, Inc.*, Applebay Exhibit 585, May 13, 1998, 7 pages.

\* cited by examiner

S11 response of the short without resistive termination of the microstrip mode.

FIG. 4 PRIOR ART

S11 response of the short with resistive termination of the microstrip mode.

PROBE TESTING STRUCTURE

CROSS REFERENCE TO RELATED DOCUMENTS

This application claims the benefit of U.S. Provisional Application No. 60/513,663, filed Oct. 22, 2003.

BACKGROUND OF THE INVENTION

The present invention relates to calibration structures for probing devices, and more particularly to improved calibration structures for suppressing undesirable electromagnetic modes resulting from the substrate of the calibration structure.

Coplanar transmission structures, such as coplanar waveguides, coplanar striplines, coplanar slotlines, and the like, are used in a wide variety of electronic applications. For example, coplanar waveguides are used in probes suitable to probe semiconductors at multi-gigahertz frequencies, such as described in U.S. Pat. No. 4,697,143. The probe described in the '143 patent has an approximately triangular shaped alumina substrate on which is formed a coplanar waveguide that tapers toward the point of the triangle. Bulk microwave absorbing material containing iron or ferrite and having a high magnetic loss coefficient is secured on both surfaces of the substrate to reduce the effect of unwanted propagation modes. One of these propagation modes includes energy that propagates up the probe substrate and reflects off of the probe mounting block and propagates back down the substrate producing undesired distortions of the measured signals.

Probes allow relatively accurate on-wafer measurements of very small devices, such as transistors, inductors, capacitors, resistors, and the like at frequencies from direct current to hundreds of giga-hertz. Relatively accurate measurements can be made using one or more such probes connected to a vector network analyzer and then calibrating the system using a calibration substrate. The calibration substrate has various types of planar calibration elements formed on it, such as Line-Reflect-Line (LRL) calibration elements, Line-Reflect-Match (LRM) calibration elements, Open-Short-Load-Thru (OSL-T) calibration elements, and the like. Deviations from the ideal response of the probe/calibration substrate combination are stored in the network analyzer and software algorithms are typically used to compensate for these detected deviations as well as the non-ideal response of the network analyzer and the interface to the probe.

The calibration substrate is positioned on a conductive chuck and is typically maintained in position by a vacuum. The conductive chuck acts as a ground plane for the undesired microstrip modes when a signal is applied through the probe. In addition to the undesired microstrip modes, undesirable surface wave modes propagate through the substrate. Quartz spacers have been placed under the calibration substrate to reduce the parasitic modes generated in the calibration substrate. However, even with quartz spacers the parasitic modes still produce resonances, such as in the incident to reflected signal ratio as measured by the network analyzer.

Unsuccessful attempts have been made to reduce the surface wave modes on the calibration substrate by locating a limited amount of lossy material, such as nichrome (nickel chromium alloy), along the opposing edges of the calibration elements. However, the dimension of the nichrome material is much shorter than the wavelength of the signal being coupled into the calibration element. Therefore, it has little effect on surface wave modes which propagate along the bottom surface of the substrate. Additionally, it has little effect on the microstrip modes generated by the conductive chuck acting as a ground plane for the calibration elements.

Referring to FIG. 1, a cross-sectional view of the coplanar transmission structure 10 described in U.S. Pat. No. 5,225,796 is shown. The coplanar transmission structure 10 includes a substrate 12 having a coplanar transmission line 14, shown as a coplanar transmission waveguide, formed on one surface thereof. The substrate 12 is formed from a dielectric material, such as alumina or sapphire. The coplanar transmission line 14 may also be a coplanar stripline, as in FIG. 2. The coplanar transmission waveguide 14 includes a center strip 16 with two ground planes 18 and 20 located parallel to and in the plane of the center strip 16. The coplanar transmission line 14 defines the electromagnetic mode of radiation propagating along the transmission line 14, such as a quasi-TEM mode of propagation. The opposite surface of the substrate 12 has a layer of lossy resistive material 22, such as nichrome, tantalum nitride, or the like formed thereon.

The use of a lossy resistive material tends to attenuate the parasitic evanescent or propagating electromagnetic modes of the coplanar transmission structure. FIG. 2A shows a plan view of a coplanar transmission structure having an asymmetrical coplanar stripline 24 formed on one surface of a sapphire substrate 26. A layer of nichrome 28 is deposited adjacent and connected to the ground of the stripline 27. The cross-sectional view of FIG. 2B shows another approach to adding lossy material, with the layer of nichrome 30 formed on the opposite surface of the substrate 26.

Unfortunately, the structures shown in FIGS. 1 and 2 tend to result in relatively distorted signals over a large range of frequencies. The distortion results from undesirable modes propagating within the substrate. The precise source of the undesirable modes is unknown which results in difficulty in reducing the undesirable modes. The distortion levels are sufficiently large that for very accurate measurements the calibration substrate is simply ineffective.

A calibration substrate available from Cascade Microtech of Beaverton, Oreg. includes a set of calibration structures. Referring to FIG. 3, the calibration structures include a set of conductive members 54 supported by the substrate and spatially arranged across the substrate. Similar conductive members are aligned in an array orientation. To effectively increase the frequency response and smooth out the frequency response of the microstrip mode of the conductive members to the base of the substrate, a small portion of resistive material 56 is located adjacent to the end of each of the conductive members. The wider conductive members are approximately 525 microns wide and the thinner conductive members are approximately 100 microns wide, with a spacing of approximately 750 microns between conductive material columns. The resistive material is approximately 150 microns in length and has a width equal to that of the conductive material. The conductive members are approximately 1400 microns in length. The column of conductive members 60 are for open calibration tests, the column of conductive member 62 are for load calibration tests, the column of conductive members 64 are for short calibration tests, the column of conductive members 66 are for through conductive tests, and the column of conductive members 68 are for loop back through conductive tests.

While providing an improved measurement accuracy, the resulting structure includes a resonance at approximately 33 giga-hertz having a magnitude of approximately 0.10-0.15 dB deviation from the ideal (0 dB) when measuring a short calibration structure (S11 measurement), as shown in FIG. 4. The S11 magnitude in dB is calculated as 20*log(x), where x is the magnitude of the return signal with the input normalized to 1. This resonance makes probing of semiconductors more difficult in the general range of 33 giga-hertz because it is difficult to calibrate the system. In the case of a resonant system, Q is a measure of the sharpness of the resonant peak in the frequency response of the system and is inversely proportional to the damping in the system, and may be also considered the reactive portion over the resistive portion of the impedance causing the resonance. For example, Q=(center frequency in hertz)/(bandwidth (0.707 times down (3 dB reduction in magnitude) from the maximum magnitude at the center frequency)). Referring to FIG. 4, the Q factor of the impedance causing the 33 GHz resonance is approximately 22.

What is desired is calibration structures that reduce unwanted spurious modes.

DETAILED DESCRIPTION OF THE PREFERRED EMBODIMENT

Figure 5:
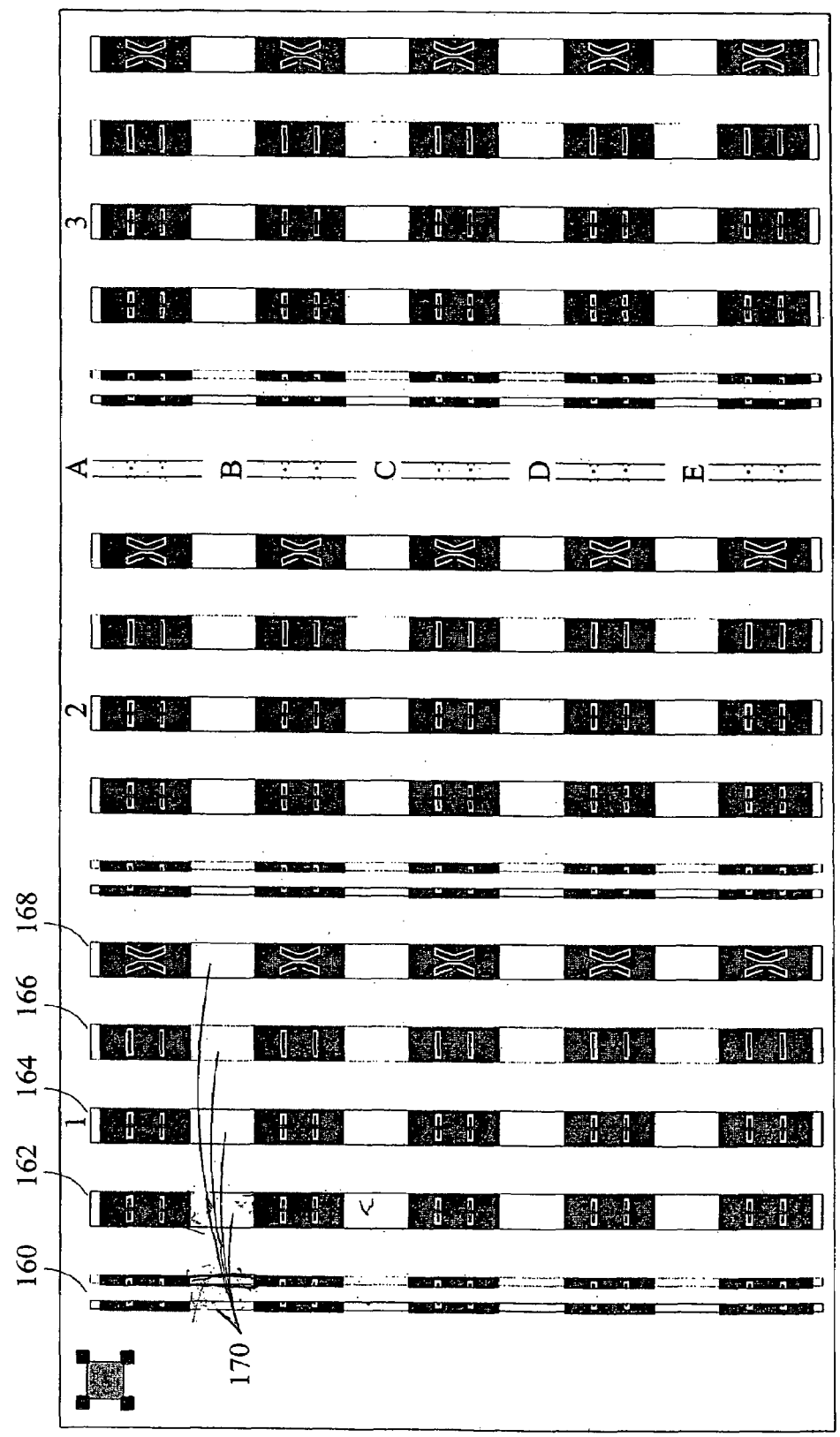
FIG. 5 illustrates a modified calibration substrate.

Referring to FIG. 5, a calibration substrate that includes one or more conductive members is illustrated. The structures on the calibration substrate are modeled by the manufacturer with some degree of accuracy so that the probe, network analyzer, and cabling between the probe and network analyzer can be accurately modeled with some degree of precision.

Figures 6A, 6B, 6C:
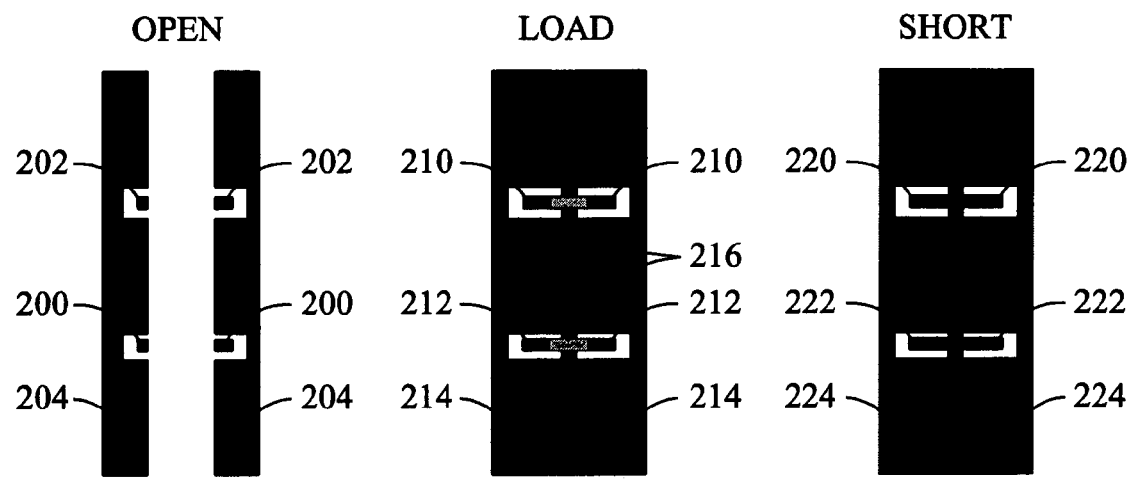
FIGS. 6A-6E illustrate calibration regions.
Figures 6D, 6E:
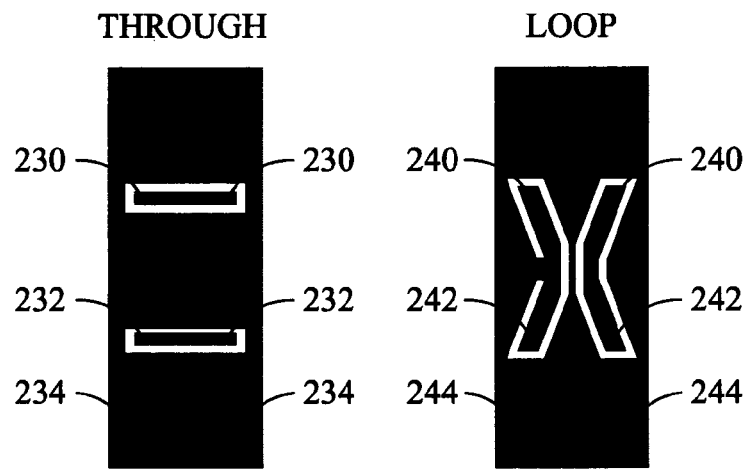

The preferred dimensions include the wider conductive members being approximately 525 microns wide and the thinner conducive members being approximately 100 microns wide. The length of the conductors are preferably 1400 microns. The column of conductive members 160 are for open calibration tests, the column of conductive member 162 are for load calibration tests, the column of conductive members 164 are for short calibration tests, the column of conductive members 166 are for through conductive tests, and the column of conductive members 168 are for loop back through conductive tests. In general, the signal paths are located on the small conductive regions within each larger conductive region. Similarly, in general the ground paths are located on the larger conductive regions. In some cases, the signal and ground conductive portions are tied together. Referring to FIG. 6A, for example, the open conductive test 160 for a dual path test includes a pair of signal conductive regions 200 and 202, and a ground conductive region 204. Referring to FIG. 6B, for example, the load conductive test 162 for a dual path test includes a pair of signal conductive regions 210 and 212, and a ground conductive region 214, where the respective conductive regions 210 and 212 are interconnected by a resistive material 216, such as a 50 ohm/square resistive material. Referring to FIG. 6C, for example, the short conductive test 164 for a dual path test includes a pair of signal conductive regions 220 and 222, and a ground conductive region 224 which is electrically connected to the signal conductive regions 220 and 222. Referring to FIG. 6D, for example, the through conductive test 166 for a dual path test includes a pair of signal conductive regions 230 and 232, and a ground conductive region 234. Referring to FIG. 6E, for example, the loop back conductive test 168 for a dual path test includes a pair of signal conductive regions 240 and 242, and a ground conductive region 244.

The calibration may include any suitable technique, such as for example, line-reflect-match, short-open-load, through-reflect line, line-reflect-reflect-match, short-open-load-through, and short-open-load-reciprocal. Deviations from the ideal response of the probe/calibration substrate combination are stored in the network analyzer and software algorithms may be used to compensate for these detected deviations as well as the non-ideal response of the network analyzer and the interface to the probe.

Figure 1:
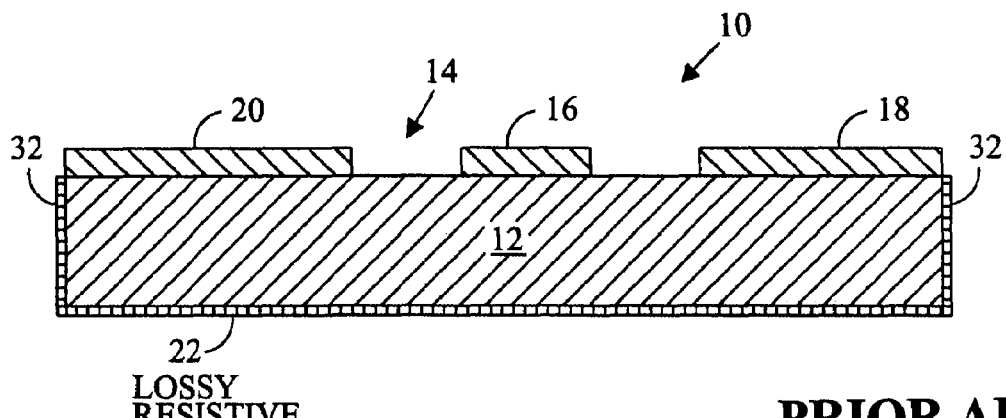
FIG. 1 is a cross-sectional view of a coplanar transmission structure.
Figure 2A:
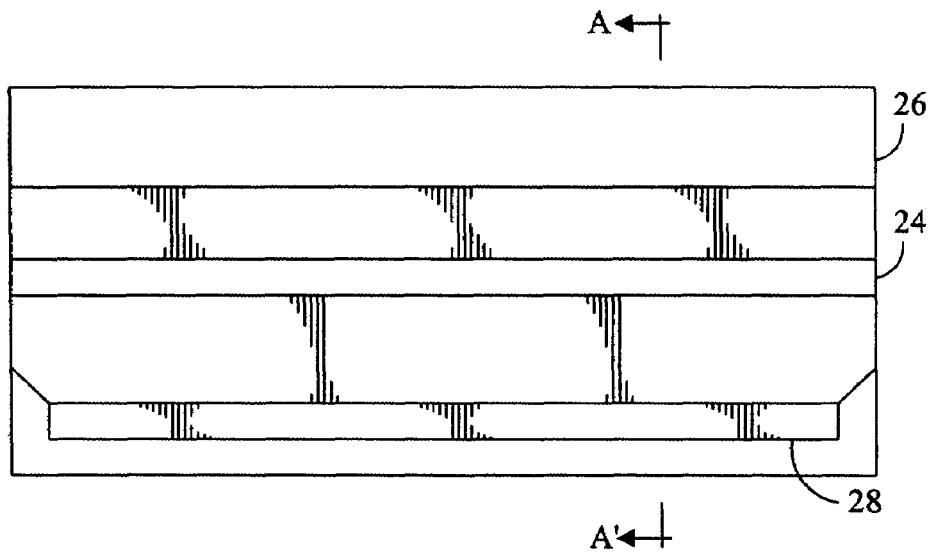
FIGS. 2A-B are plan and cross-sectional views of coplanar stripline cases incorporating resistive layers.
Figure 2B:
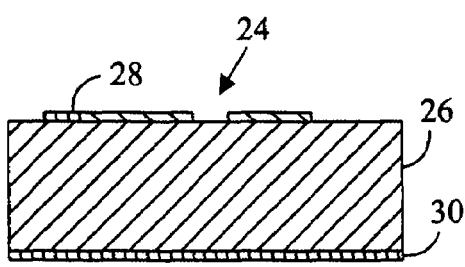
Figure 3:
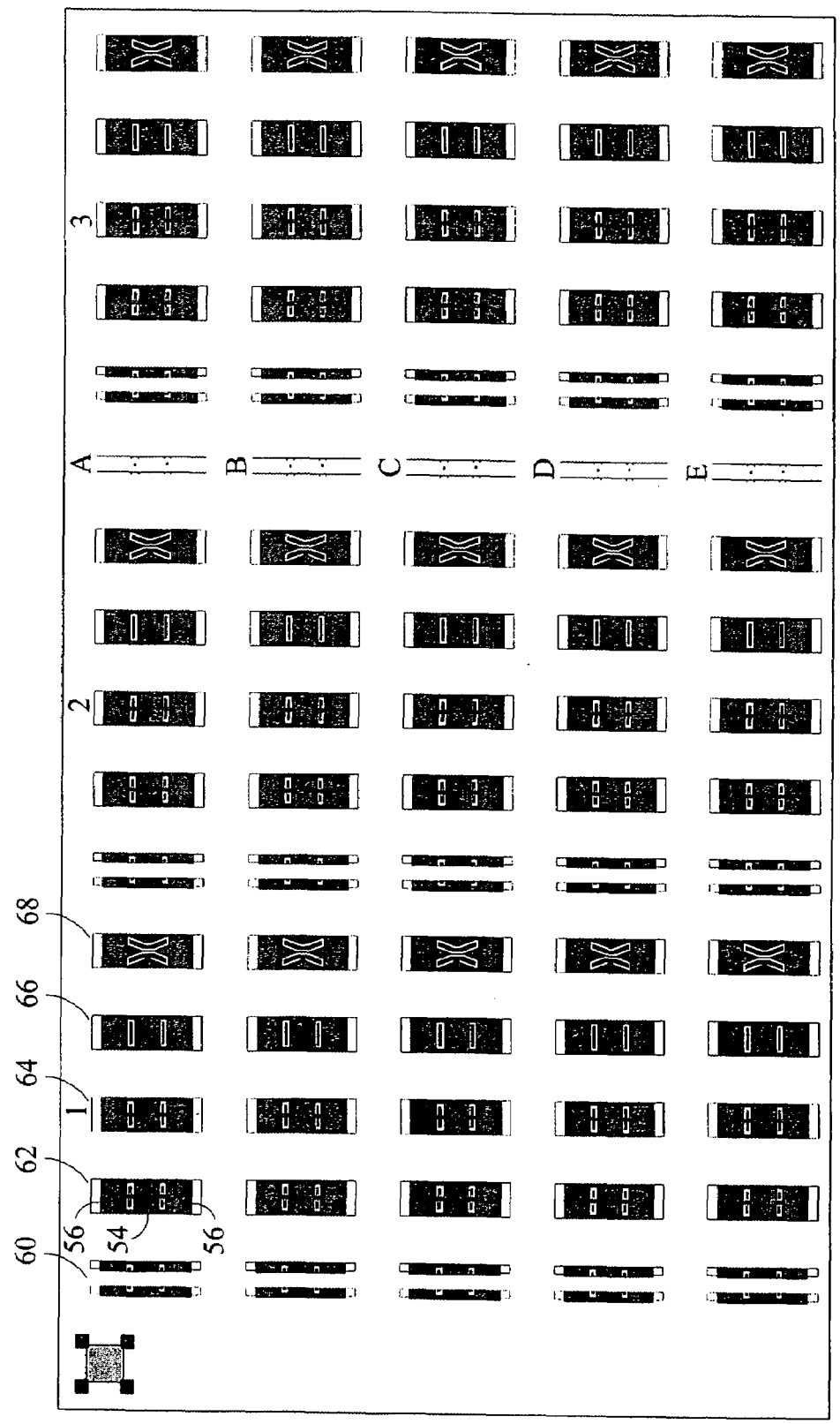
FIG. 3 illustrates an existing calibration substrate.
Figure 4:
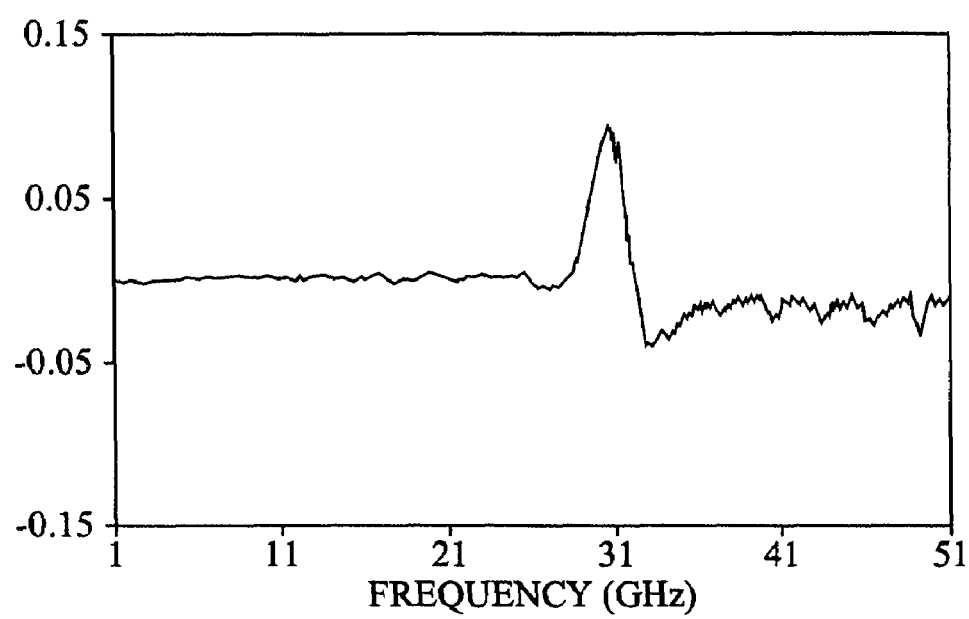
FIG. 4 illustrates S11 response of a short without resistive termination of the microstrip mode.
Figure 7:
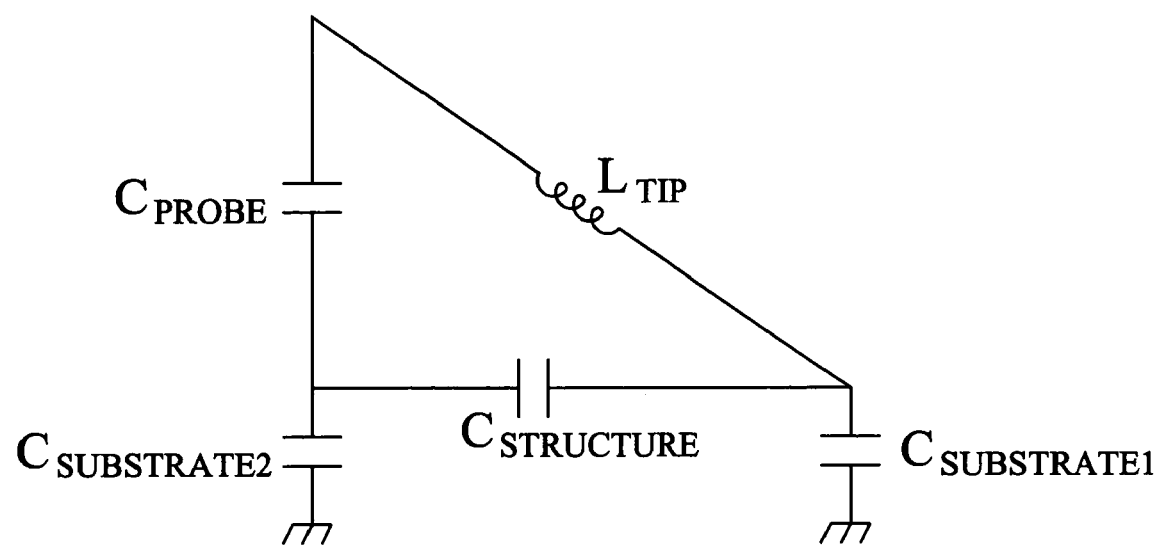
FIG. 7 illustrates a LC circuit.

The present inventor considered the effects of the resonance frequency occurring at approximately 33 GHz for the structure shown in FIG. 3. The present inventor speculated that one potential explanation for the observed effect is that there exists a significant capacitance "$C_{structure}$" between adjacent columns of calibration resistor/conductor/resistor structures. In addition, during the calibration process there exists another significant capacitance "$C_{probe}$" between the probe itself and the adjacent calibration structure to the one being tested. Further, during the calibration process the ground path of the probe tip has a significant inductance $L_{tip}$. As illustrated in FIG. 7, the resulting pair of capacitances $C_{structure}$ and $C_{probe}$ together with the inductance $L_{tip}$ result in a inductor-capacitor (LC) resonance structure.

This LC resonance structure varies by including additional probe tip inductance and additional mutual inductance between the probe tips when the substrate is used for calibration of a dual (or more) signal path probe. For example, the probe may include a ground/signal/ground/signal/ground structure where the pair of signal paths may be located on different conductive members during calibration. The substrate may likewise be used for single port calibrations between a pair of probes or for a single probe or one to multiple ports. Further, in most cases the signal lines may be used for input or output or both.

The recognition of the existence of the capacitance between different conductive portions of the substrate provides insight into one potential source of the undesirable distortion. To modify the distortion, one technique may be to space the conductive members at locations further distant from one another. This results in a decrease in the capacitance between the conductive members. As the capacitance between the conductive members is decreased the resonance frequency of the effective LC circuit is increased. With sufficient increase in the resonance frequency, the resonance may occur at a frequency that is not of interest during measurement, such as above 200 giga-hertz. Unfortunately, increasing the spacing between the conductive members results in fewer calibration structures on the substrate, which become worn after repeated use.

Another resonance can occur from the length and width of the ground conductor approaching a half-wavelength at the frequencies of interest. In this case, $C_{probe}$ and $C_{structure}$ additionally couple to such resonators, which can further distort the desired signals.

Figure 8:
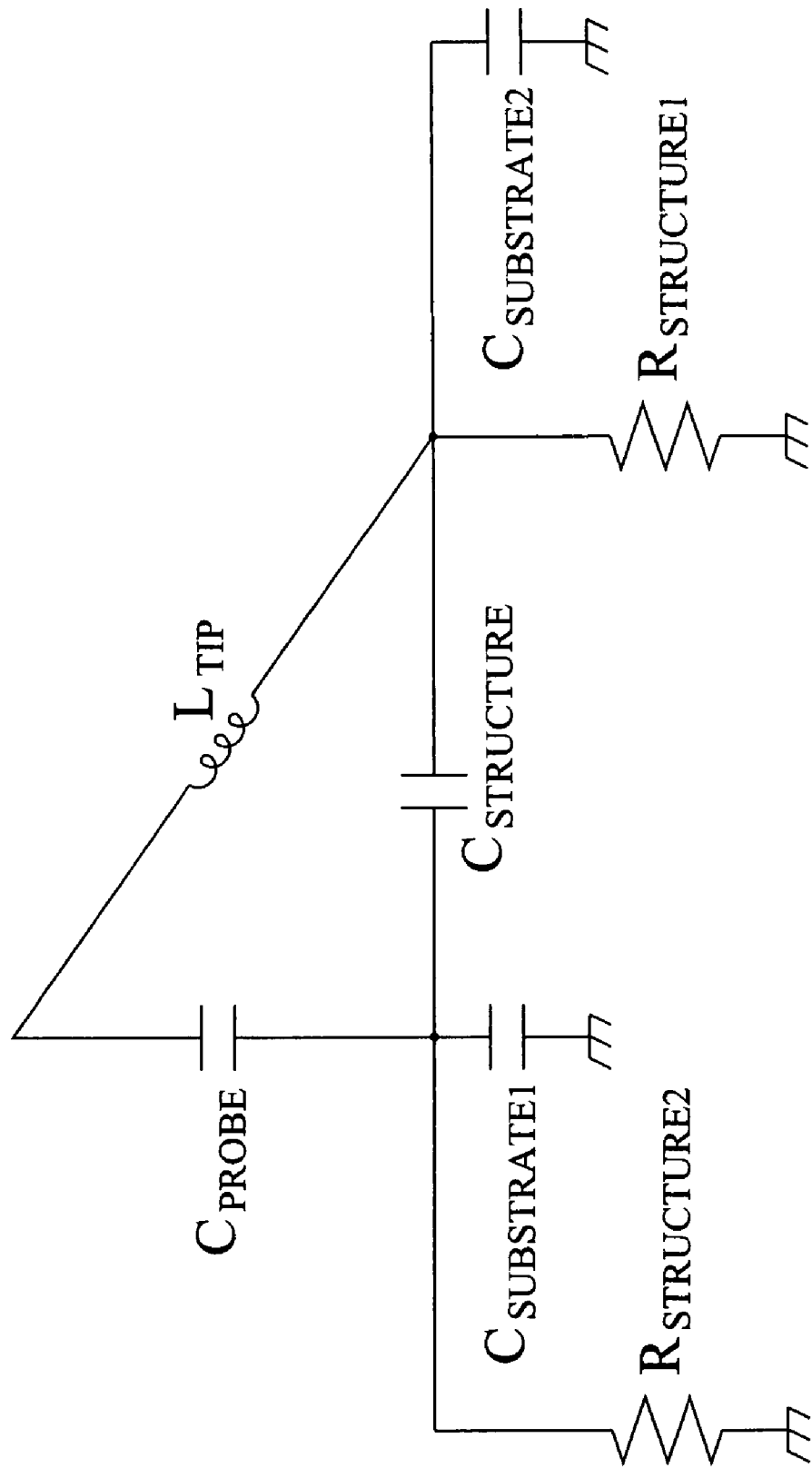
FIG. 8 illustrates a LCR circuit.
Figure 9:
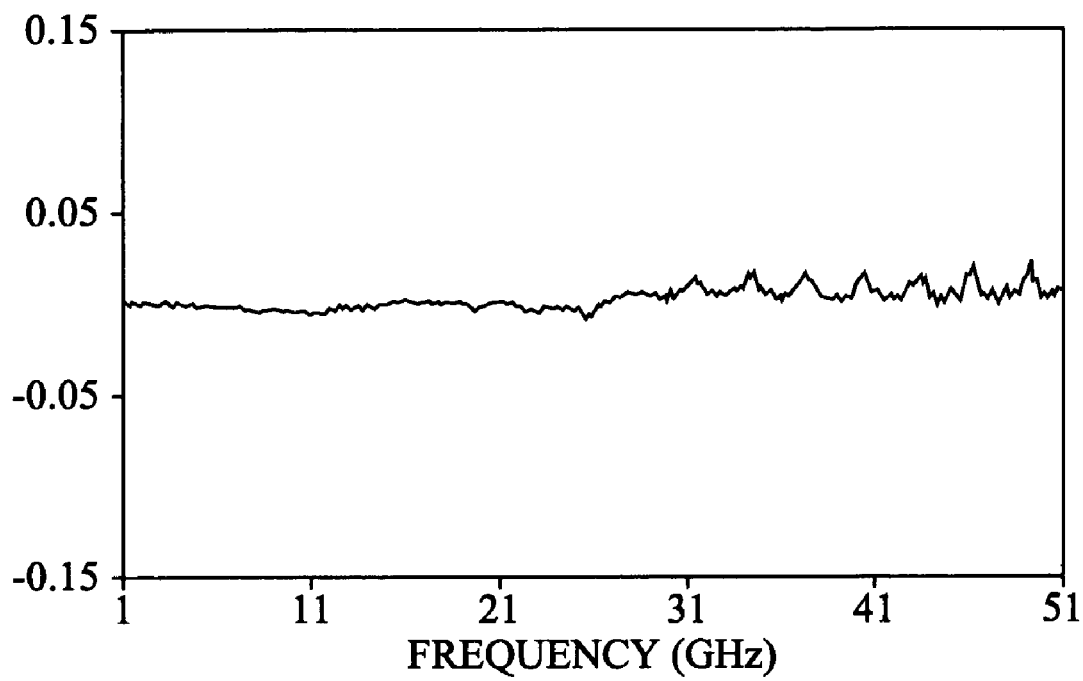
FIG. 9 illustrates S11 response of a short with resistive termination of the microstrip mode.

To provide a more suitable calibration substrate while reducing the resonances identified, the present inventor came to the realization that a resistive element 170 should be included in the LC circuit to effectively provide an LCR circuit, as illustrated in FIG. 8. The additional resistive element $R_{structure}$ is sufficient to dampen the resonance aspects of the structure to a sufficiently small level. In the preferred structure, the resistive element interconnects the two adjacent conductive elements. Measurements resulting from the modified structure show a deviation from ideal of less than 0.02 dB in a measurement of the short structure (S11 measurement). In contrast, the previously existing structures that included resistive material did not have a sufficiently wide resistor area to reduce the resonance(s), whatever their origin. The present inventor speculates that the narrow resistors of existing structures provide insufficient capacitance between the resistor material to the ground plane such that little current flows in the resistor material, thus resulting in a relatively high Q. Accordingly, the present inventor speculates that with additional resistor material or additional resistance sufficient capacitance exists between the resistive material and the ground plane so that sufficient current flows in the resistive material thus lowering the Q of the resonator structure created by the ground conductor.

The modified structure has a characteristic that was previously unobtainable with a loss of less than 0.05 dB between 5 GHz and 100 GHz, and more preferably between 10 GHz and 70 GHz, more preferably between 20 and 60 GHz, more preferably between 30 GHz and 50 GHz, or and more preferably a loss of less than 0.025 dB between these ranges (S11 measurement). This measurement may be characterized as the vector difference between the structure's S11 and the S11 of a relatively trusted short or open. Further, the modified structure permits the Q of the resonance to be substantially reduced, such as to a value less than 5, more preferably less than 3, more preferably less than 2, and more preferably less than approximately 1. While the resistive material is preferably connected to both of the conductive materials and extends the entire distance between the conductive materials, less resistive material may likewise be used, if desired. For example, the resistive material may extend at least 50% of the distance between the conductive members, more preferably at least 75% of the distance between the conductive members, more preferably at least 90% of the distance between the conductive members, and more preferably at least 95% of the distance between the conductive members. Furthermore, resistive material may be included between the columns of conductive materials and extend the entire distance between the conductive materials. Also, less resistive material may be included between the columns of conductive materials, if desired, and more preferably between the conductive materials. For example, the resistive material may extend at least 50% of the distance between the conductive members, more preferably at least 75% of the distance between the conductive members, more preferably at least 90% of the distance between the conductive members, and more preferably at least 95% of the distance between the conductive members.

Figure 10:
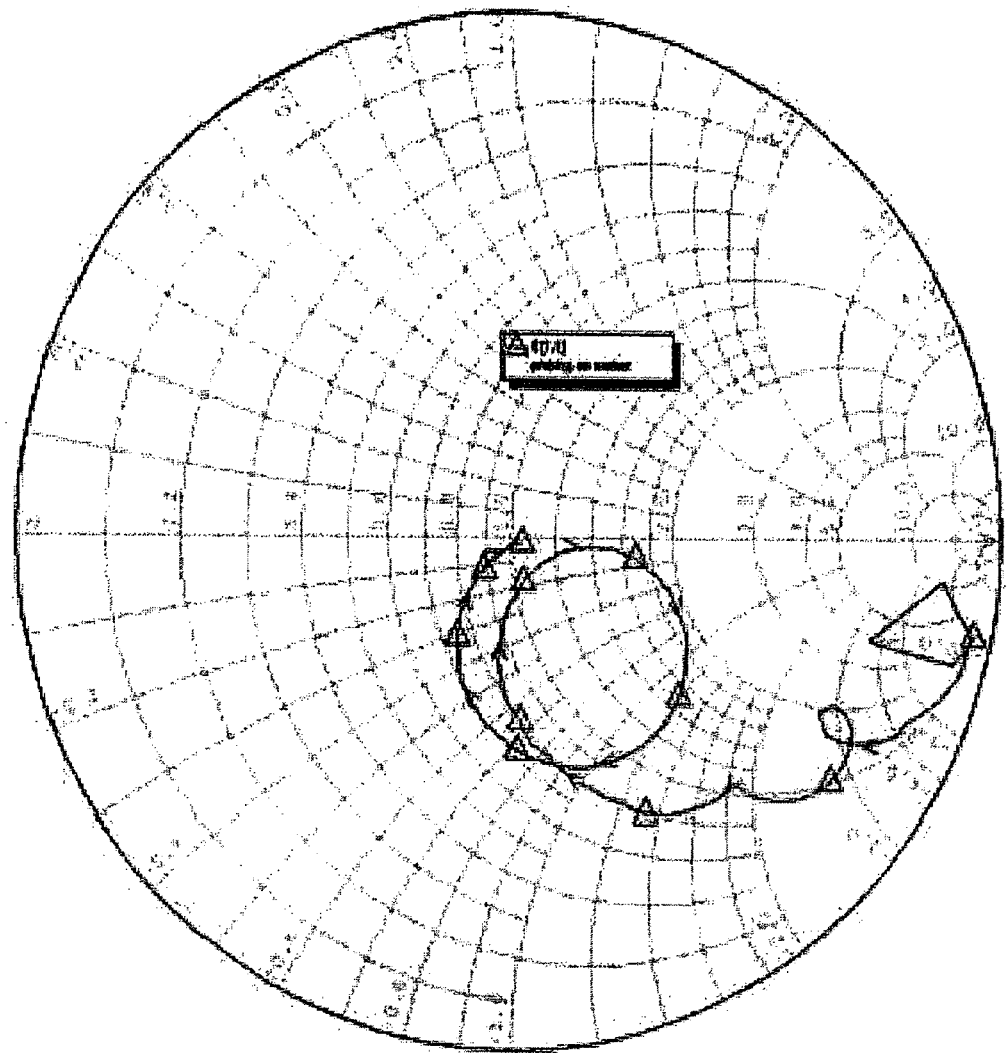
FIG. 10 illustrates a smith chart of the impedance matches of the probe impedance without resistive material.
Figure 11:
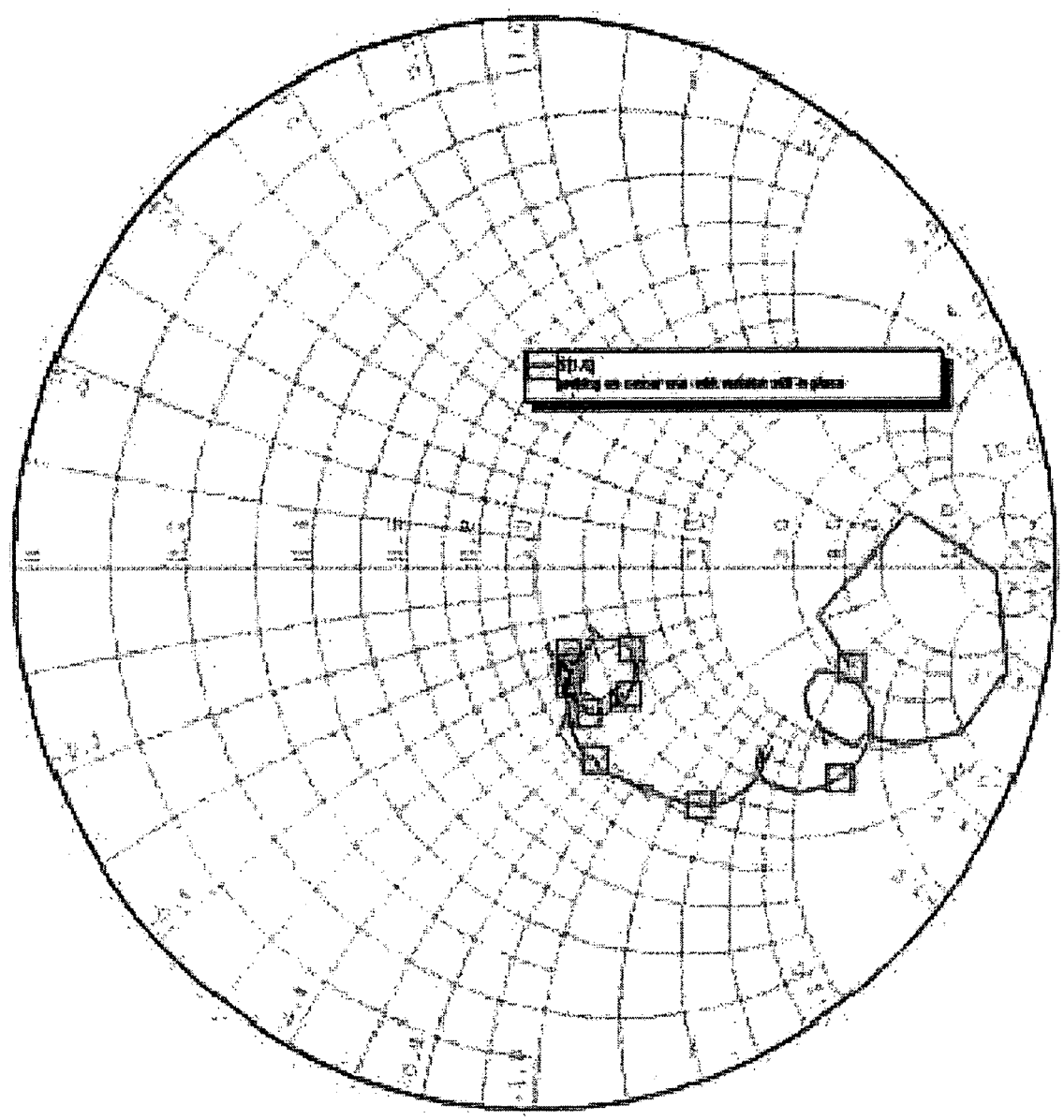
FIG. 11 illustrates a smith chart of the impedance matches of the probe impedance with limited resistive material.

By way of illustration, a test was performed without additional resistive material and an indication of the conductive member resonance seems to occur when the impedance matches the probe and system impedance around 22 GHz and 52 GHz, as illustrated in FIG. 10. In addition, at 33 GHz, the resonance is observed while probing the short on a conductive member. With adjacent resistors having a resistance of approximately 60 ohms the reactive part of the impedance of 60-j60 at approximately 33 GHz is generally matched, as illustrated in FIG. 11. The present inventor speculated that another potential source of this effect is that the additional resistive material, as shown in FIG. 5, in effect substantially matches the imaginary part (within 10%) of the mode conversion at that frequency to reduce or otherwise eliminate the resonance.

The present inventor, based upon the aforementioned observation, considered that during the calibration process the probe maintains a signal primarily in a single mode, such as CPW mode (coplanar waveguide). The signal propagating in the CPW mode is imposed on the calibration substrate. The majority of the signal is maintained in the CPW mode by the calibration substrate. However, a portion of the signal in the CPW mode is converted by the calibration structures into other modes, such as a microstrip mode between the conductive members and the bottom of the substrate. At particular frequencies for particular configurations, this mode conversion from CPW to microstrip is substantial, such as 33 GHz as previously discussed. Accordingly, one explanation of the beneficial effects of the resistor material is that it is terminating the microstrip mode in a resistance substantially equal to its characteristic impedance. If not connected to other conductors, the resistor area should be wide enough to create sufficient capacitance to the ground plane to cause the ground conductor to see an impedance substantially equal to the characteristic impedance of the undesired mode (within +/−25 percent, more preferably within +/−10 percent). The resistive material preferably has a resistance that is within +/−25 percent, more preferably within +/−10 percent, of the characteristic impedance of the microstrip mode. Also, the length of the resistive material is preferably sufficient to provide an impedance substantially equal to the characteristic impedance of the undesired mode, preferably within +/−10 percent, and preferably within +/−25 percent. Also, the area of the resistive material is preferably sufficient to provide an impedance substantially equal to the characteristic impedance of the undesired mode, preferably within +/−10 percent, and preferably within +/−25 percent. The thickness of the substrate and/or its dielectric constant is preferably sufficient such that the conductive region (ground conductor and/or signal conductor(s)) and/or resistive material has an impedance substantially equal to the characteristic impedance of the undesired mode, preferably within +/−10 percent, and preferably within +/−25 percent.

In many cases the characteristic impedance of the microstrip mode to the ground plane is related to the ratio of the width of the microstrip (resistor and/or conductive region (ground conductor and/or signal conductor(s)) to the substrate thickness. Therefore, the resistive material may be considered as a very lossy microstrip line of similar impedance which preferably has a length substantially the same as the length of the ground conductor, within +/−10 percent, within +/−25 percent, within +/−50 percent, within +/−75 percent. If the resistive element is considered as a series of lumped elements, a longer resistive structure has more capacitance to the ground plane, thus providing a termination resistor.

In other embodiments, the resistive material may be of a length greater than 300 microns, more preferably greater than 500 microns, and more preferably greater than 750 microns. The resistive material may likewise have the same width as the conductive region, or within 75% of the same width. Also, the resistive material may be characterized as having a total resistance (per side) of more than 40 ohms, more preferably more than 45 ohms, more preferably more than 50 ohms, and more preferably more than 55 ohms. Furthermore, the S11 characteristics, Q value characteristics, resistive material characteristics, and reactive characteristics may be related to a single combination of a conductive member and resistive material without relation to other conductive members or other resistive members.

The relationships described herein may be considered as is without regard to the type of resistive material used. Also, the relationships described herein are preferably for a resistive material of approximately 50 ohms/square (within +/−5 percent, within +/−10 percent, within +/−25 percent). However, if the resistance of the resistive material is other than 50 ohms/square then the width of the conductive region (ground conductors and/or signal conductors) and/or resistive material, thickness of the substrate, dielectric constant of the substrate, length of the conductive region (ground conductors and/or signal conductors) and/or resistive material, may be modified to maintain the same ratios and/or the same characteristic impedance matching.

The substrate may include microwave absorbing material between the substrate and the chuck, if desired. Further, microwave absorbing material may be located on the sides and/or the top surface of the substrate, if desired. Also, the chuck may be, for example, conductive, non-conductive, lossy, supporting an upper dielectric layer, supporting an upper microwave absorbing material. In addition, the characteristics of the resistive material may likewise be included with conductive regions on a calibration substrates for a single channel, such as merely a ground region and a signal region.

The resistive material may have different sheet resistances to match different application needs depending on the characteristic impedance of the device under test. Additionally patterning of the lossy material in various shapes may be chosen to meet specific application needs.

Figure 12:
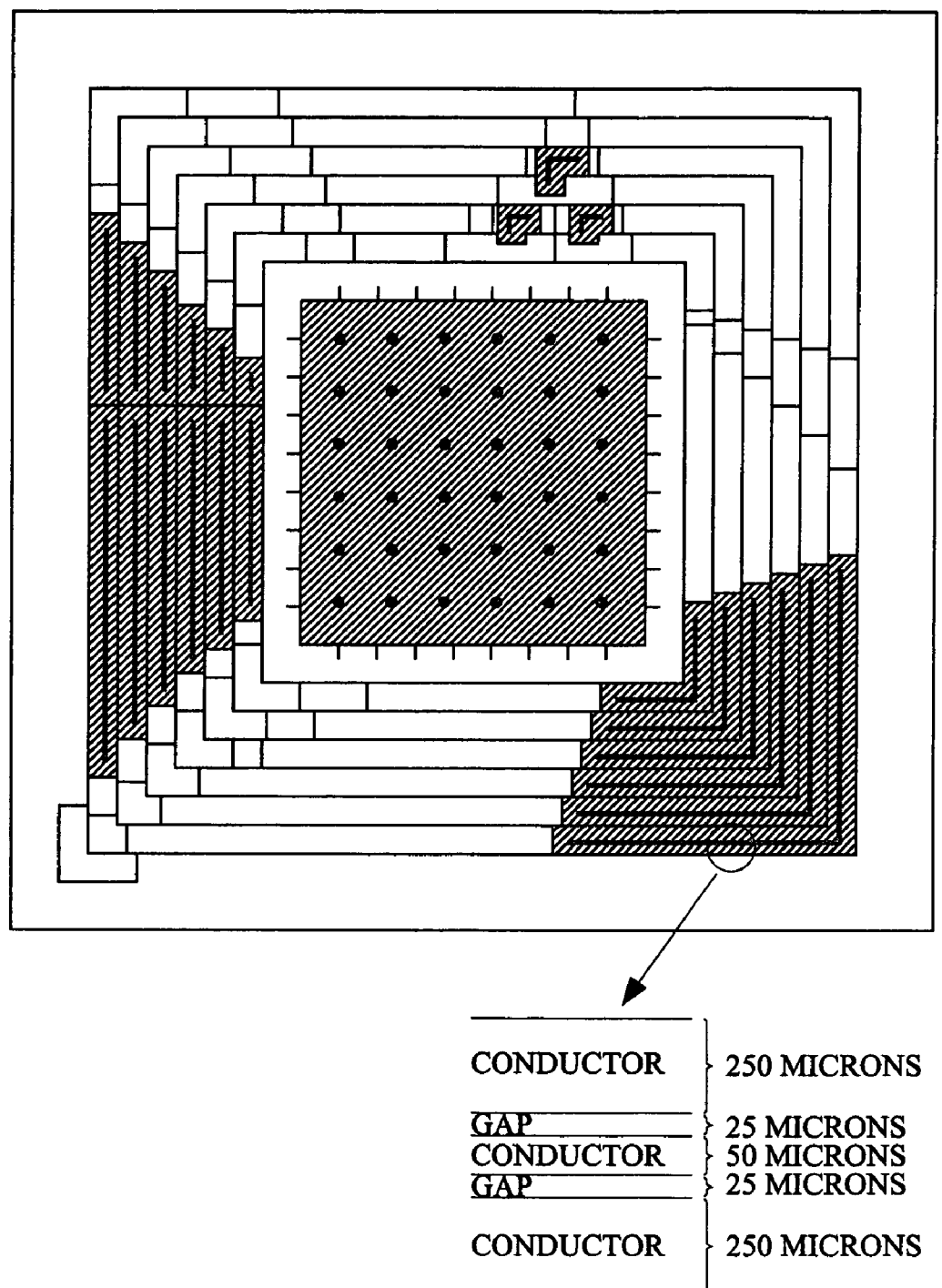
FIG. 12 illustrates another calibration structure.

Another calibration structure is shown in FIG. 12 suitable for membrane type probes available from Cascade Microtech, Inc. of Beaverton, Oreg. The structure includes conductive regions, such as elongate ground conductors with a signal conductor between a pair of ground conductors separated by a gap or dielectric material. The conductive regions are preferably spaced apart by gaps or dielectric material. Between different conductive regions may be dielectric or resistive material. The central region includes a large conductive region and individual pads for the probing contacts which may be electrically isolated form the large conductive region.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A calibration substrate for calibrating a probe comprising:
   (a) a first conductive member associated with a first calibration test site and supported by said substrate suitable to be electrically interconnected with a first signal path of said probe;
   (b) a second conductive member associated with said first calibration test site and supported by said substrate suitable to be electrically interconnected with a second signal path of said probe, said second conductive member electrically isolated from said first conductive member;
   (c) a third conductive member associated with said first calibration test site and supported by said substrate suitable to be electrically interconnected with a ground path of said probe, said third conductive member electrically isolated from each of said first and second conductive members;
   (d) a fourth conductive member associated with a second calibration test site, spaced apart from said first calibration test site, and supported by said substrate suitable to be electrically interconnected with a first signal path of another probe;
   (e) a fifth conductive member associated with said second calibration test site supported by said substrate suitable to be electrically interconnected with a second signal path of said another probe, said fifth conductive member electrically isolated from said fourth conductive member;
   (f) a sixth conductive member associated with said second calibration test site supported by said substrate suitable to be electrically interconnected with a ground path of said another probe, said sixth conductive member electrically isolated from each of said fourth and fifth conductive members; and
   (g) a resistive member supported by said substrate and positioned between said third conductive member and said sixth conductive member and extending 100% of the distance between said third conductive member and said sixth conductive member and having a width substantially equal to that of said third and sixth conductive members.

2. The substrate of claim 1 wherein the S11 characteristic from said first, second, and third conductive members has a loss of less than 0.05 dB between 30 GHz and 50.

3. The substrate of claim 1 wherein the S11 characteristic from said first, second, and third conductive members has a Q factor of less than 5 between 30 GHz and 50.

4. The substrate of claim 1 wherein said resistive material matches within 10 percent the imaginary part of the primary mode conversion between 30 GHz and 50.

5. The substrate of claim 1 wherein said resistive material that includes a member has a resistance that reduces a resonance effect between 10 GHz and 100 GHz that would have otherwise occurred if the resistive material was not included to a level less than 50% of what would have otherwise occurred.

* * * * *

UNITED STATES PATENT AND TRADEMARK OFFICE
CERTIFICATE OF CORRECTION

PATENT NO.         : 7,250,626 B2                                        Page 1 of 1
APPLICATION NO. : 10/794246
DATED              : July 31, 2007
INVENTOR(S)        : Timothy E. Lesher It is certified that error appears in the above-identified patent and that said Letters Patent is hereby corrected as shown below:

Col. 7, line 51
Change "isolated form" to --isolated from--.

Col. 8, line 46
Change "50" to --50 GHz--.

Col. 8, line 49
Change "50" to --50 GHz--.

Col. 8, line 52
Change "50" to --50 GHz--.

Signed and Sealed this

Twentieth Day of May, 2008

JON W. DUDAS
*Director of the United States Patent and Trademark Office*